(12) United States Patent
Park (10) Patent No.: US 7,812,632 B2
(45) Date of Patent: Oct. 12, 2010

(54) APPARATUS FOR ON-DIE TERMINATION OF SEMICONDUCTOR MEMORY AND METHOD OF OPERATING THE SAME

(75) Inventor: Jung-Hoon Park, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 109 days.

(21) Appl. No.: 11/646,467

(22) Filed: Dec. 28, 2006

(65) Prior Publication Data

US 2007/0236248 A1    Oct. 11, 2007

(30) Foreign Application Priority Data

Apr. 6, 2006    (KR) .................. 10-2006-0031217

(51) Int. Cl.
    *H03K 17/16*    (2006.01)
(52) U.S. Cl. .......................... 326/30; 326/82; 326/86
(58) Field of Classification Search ............... 326/21, 326/26, 30, 81–83, 86–87; 327/108, 109
    See application file for complete search history.

(56) References Cited

U.S. PATENT DOCUMENTS

| | | | |
|---|---|---|---|
| 6,026,456 A | 2/2000 | Ilkbahar | |
| 6,429,679 B1 * | 8/2002 | Kim et al. | 326/30 |
| 6,509,757 B1 * | 1/2003 | Humphrey | 326/30 |
| 6,762,620 B2 * | 7/2004 | Jang et al. | 326/30 |
| 6,768,393 B2 * | 7/2004 | Song | 333/22 R |
| 7,019,555 B2 | 3/2006 | Lee | |
| 7,064,989 B2 | 6/2006 | Na et al. | |
| 7,135,884 B1 * | 11/2006 | Talbot et al. | 326/30 |
| 7,221,193 B1 * | 5/2007 | Wang et al. | 327/108 |
| 2006/0197551 A1 | 9/2006 | Kobayashi | |

FOREIGN PATENT DOCUMENTS

| | | |
|---|---|---|
| JP | 2005-228458 | 8/2005 |
| JP | 2005-285125 | 10/2005 |
| JP | 2006-129423 | 5/2006 |

(Continued)

*Primary Examiner*—James H. Cho
*Assistant Examiner*—Christopher Lo
(74) *Attorney, Agent, or Firm*—Venable LLP; Jeffri A. Kaminski (57) ABSTRACT

The apparatus for on-die termination of a semiconductor memory includes a first ODT (On-Die Termination) voltage generating unit that outputs a first line voltage by calibrating an input voltage with a resistance ratio according to a first code having at least two bits; a first code calibrating unit that counts the first code according to the result of a comparison between the first line voltage and a reference voltage, stops the code count when the first code reaches a maximum value or a minimum value, and stores a code value based on a final count; a second ODT voltage generating unit that outputs a second line voltage by calibrating an input voltage with a resistance ratio according to the first code and a second code having at least two bits; and a second code calibrating unit that counts the second code according to the result of a comparison between the second line voltage and the reference voltage, stops the code count when the second code reaches the maximum value or the minimum value, and stores a code value based on a final count.

20 Claims, 8 Drawing Sheets

FOREIGN PATENT DOCUMENTS

| | | |
|---|---|---|
| KR | 1019980011412 | 4/1998 |
| KR | 1020000034041 A | 6/2000 |
| KR | 1020020073701 A | 9/2002 |
| KR | 1020040021110 A | 3/2004 |
| KR | 1020040083814 A | 10/2004 |
| KR | 1020040095912 A | 11/2004 |
| KR | 1020050012931 A | 2/2005 |
| KR | 1020050104225 A | 11/2005 |
| KR | 1020050104236 A | 11/2005 |
| KR | 10-0656456 | 12/2006 |
| KR | 10-0656461 | 12/2006 |

\* cited by examiner

APPARATUS FOR ON-DIE TERMINATION OF SEMICONDUCTOR MEMORY AND METHOD OF OPERATING THE SAME

BACKGROUND OF THE INVENTION

1. Technical Field

The present invention relates to a semiconductor memory, and more particularly, to an apparatus for on-die termination of a semiconductor memory and a method of operating the same.

2. Related Art

In general, signals are transmitted through a bus line having a predetermined impedance. Therefore, when two bus lines having different impedances meet each other, some of the signals are lost. On-die termination (hereinafter, simply referred to as "ODT") is a means of reducing signal loss by impedance matching of the two bus lines.

Figure 1:
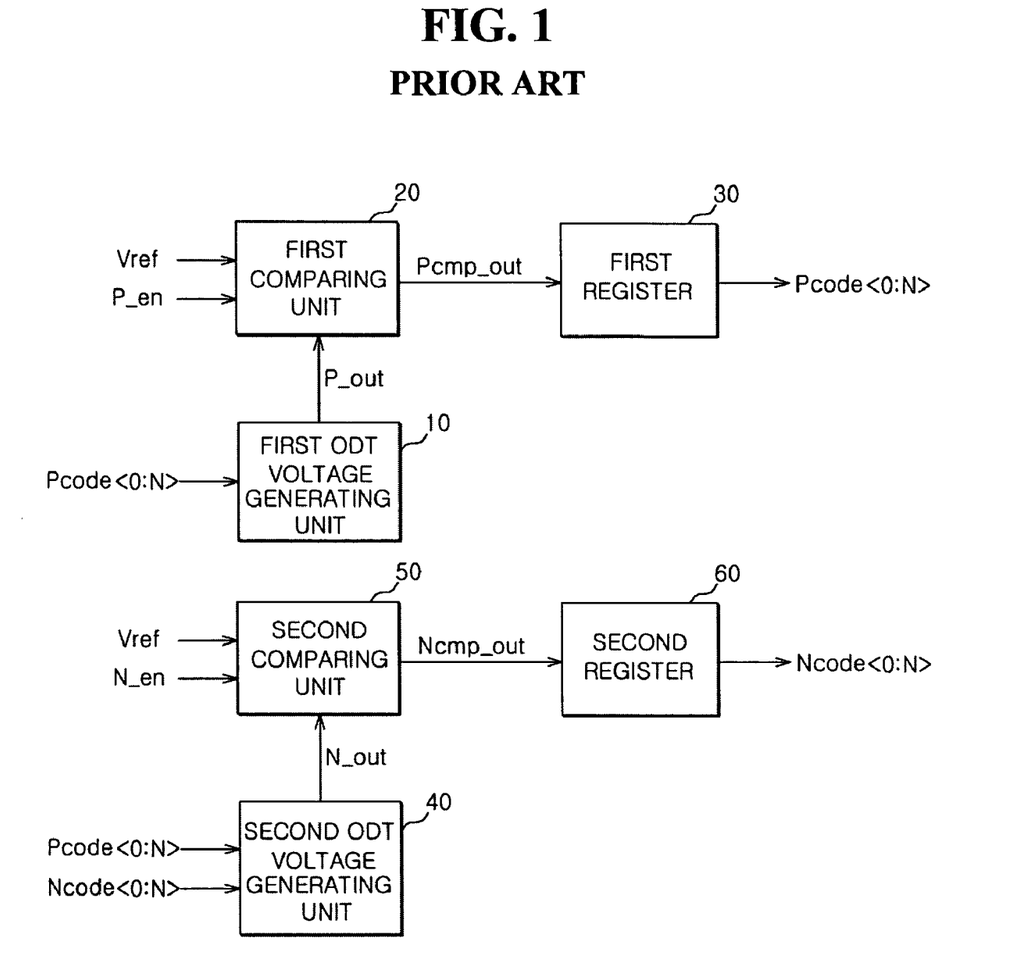
FIG. 1 is a block diagram showing the structure of an apparatus for on-die termination of a semiconductor memory according to the related art.

As shown in FIG. 1, an apparatus for on-die termination according to the related art includes a first ODT voltage generating unit 10 that outputs a first line voltage P_out by calibrating a power supply voltage VDDQ with the resistance ratio according to a first code (hereinafter, referred to as "Pcode<0:N>"); a first comparing unit 20 that compares the first line voltage P_out and a reference voltage Vref according to a first enable signal P_en so as to output a first comparison result signal Pcmp_out; a first register 30 that counts the Pcode<0:N> according to the first comparison result signal Pcmp_out; a second ODT voltage generating unit 40 that outputs a second line voltage N_out by calibrating a power supply voltage VDDQ with the resistance ratio according to the first code Pcode<0:N> and a second code (hereinafter, "Ncode<0:N>"); a second comparing unit 50 that compares the second line voltage N_out and the reference voltage Vref according to a second enable signal N_en so as to output a second comparison result signal Ncmp_out; and a second register 60 that counts the Ncode<0:N> according to the second comparison result signal Ncmp_out.

Figure 2:
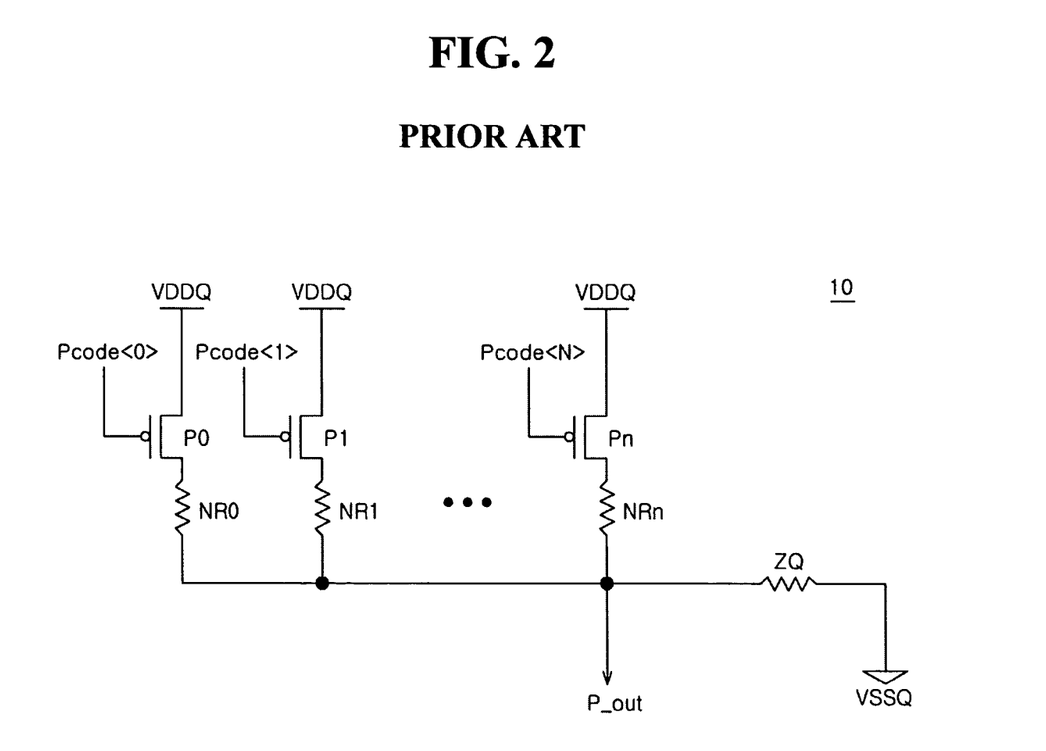
FIG. 2 is a circuit diagram showing the structure of a first ODT voltage generating unit in FIG. 1.

As shown in FIG. 2, the first ODT voltage generating unit 10 includes a plurality of transistors P0 to Pn that are respectively connected to power terminals VDDQ and are turned on according to the Pcode<0:N>; a plurality of resistors NR0 to NRn, each of which is connected between one of the plurality of transistors P0 to Pn; and an external resistor (hereinafter, referred to as "ZQ").

The first ODT voltage generating unit 10 is modeled on a data input driver because the first ODT voltage generating unit 10 needs to have the same characteristics as those when data is normally input.

Figure 3:
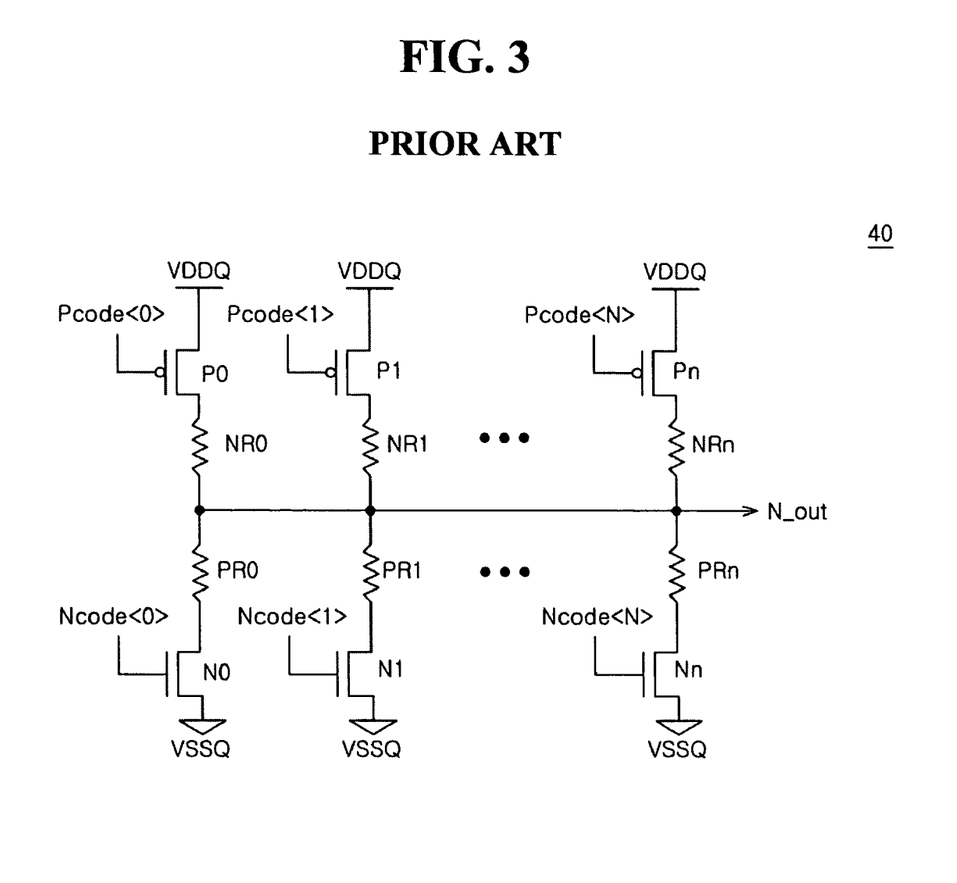
FIG. 3 is a circuit diagram showing the structure of a second ODT voltage generating unit in FIG. 1.

As shown in FIG. 3, the second ODT voltage generating unit 40 includes a plurality of transistors P0 to Pn that are connected to power terminals VDDQ and are turned on according to the Pcode<0:N>; a plurality of resistors NR0 to NRn, each of which is connected to each of the plurality of transistors P0 to Pn; a plurality of resistors PR0 to PRn that are connected to the plurality of resistors NR0 to NRn, respectively; and a plurality of transistors N0 to Nn, each of which is connected between one of the plurality of resistors PR0 to PRn and ground terminals VSSQ, and are turned on according to the Ncode<0:N>.

The second ODT voltage generating unit 40 is modeled on a data output driver because the second ODT voltage generating unit 40 needs to have the same characteristics as those when data is normally output.

The operation of the apparatus for on-die termination of the semiconductor memory according to the related art that has the above-described structure will be described below.

An initial value of the Pcode<0:N> that is previously set in the first register 30 is input to the first ODT voltage generating unit 10.

Then, the first ODT voltage generating unit 10 outputs a first line voltage P_out according to a resistance ratio between the resistors connected on the basis of the Pcode<0:N> and the ZQ.

Further, the first comparing unit 20 compares the first line voltage P_out and the reference voltage Vref according to the first enable signal P_en so as to output the first comparison result signal Pcmp_out according to the comparison.

The first register 30 counts and stores the Pcode<0:N> in a direction of increasing or decreasing the Pcode<0:N> according to the first comparison result signal Pcmp_out, and at the same time, the first register 30 outputs the counted Pcode<0:N> to the first ODT voltage generating unit 10.

The first ODT voltage generating unit 10 feeds back the first line voltage P_out based on the Pcode<0:N>, which is output from the first register 30, to the first comparing unit 20. As a result, the first comparing unit 20 repeats the above-described comparison operation and a corresponding operation of outputting the first comparison result signal Pcmp_out, thereby performing Pcode<0:N> calibration.

Meanwhile, an initial value of the Ncode<0:N> that is previously set in the second register 60, and the Pcode<0:N> whose calibration is completed in the first register 30 are input to the second ODT voltage generating unit 40.

The second ODT voltage generating unit 40 outputs the second line voltage N_out according to a resistance ratio between the resistors connected on the basis of the Pcode<0:N> and the resistors on the basis of the Ncode<0:N>.

Then, the second comparing unit 50 compares the second line voltage N_out and the reference voltage Vref according to the second enable signal N_en to thereby output the second comparison result signal Ncmp_out according to the comparison.

Then, the second register 60 counts and stores the Ncode<0:N> in a direction of increasing or decreasing the Ncode<0:N> according to the second comparison result signal Ncmp_out, and at the same time, the second register 60 outputs the counted Ncode<0:N> to the second ODT voltage generating unit 40.

At this time, the second ODT voltage generating unit 40 feeds back the second line voltage N_out according to the Ncode<0:N>, which is output from the second register 60, to the second comparing unit 50. As a result, the second comparing unit 50 repeats the above-described comparison operation and a corresponding operation of outputting the second comparison result signal Ncmp_out, thereby performing Ncode<0:N> calibration.

In the related art, during the Pcode<0:N> and the Ncode<0:N> calibration, the resistance value needs to be large when the first line voltage P_out and the second line voltage N_out are larger than the reference voltage Vref. Therefore, the value of the Pcode<0:N> is increased and the value of the Ncode<0:N> is decreased.

Further, when the difference between the resistance of the external resistor, ZQ, and the internal resistance is in an adjustable range, as code calibration is performed the increase and decrease of the Pcode<0:N> and the Ncode<0:N> is repeated in a predetermined range. When the code calibration is completed, the Pcode<0:N> and the Ncode<0:N> are set to values in a desired range.

Meanwhile, when the difference between the resistance of the ZQ and the internal resistance is not in the adjustable range, it is preferable that each of the Pcode<0:N> and the Ncode<0:N> be set to the maximum value or the minimum value in order to minimize resistance errors of data input and output drivers.

However, when the difference between the resistance of ZQ and the internal resistance is large, each of the Pcode<0:N> and the Ncode<0:N> repeatedly changes to the maximum value or the minimum value in a total variable range. Further, when the calibration is completed, the Pcode<0:N> and the Ncode<0:N> are set to values that are completely different from the desired values.

SUMMARY OF THE INVENTION

Embodiments of the present invention provide an apparatus for on-die termination of a semiconductor memory and a method of the same, that can prevent code calibration errors.

An embodiment of the present invention provides an apparatus for on-die termination of a semiconductor memory, which includes a first ODT (On-Die Termination) voltage generating unit that outputs a first line voltage by calibrating an input voltage with a resistance ratio according to a first code having at least two bits; a first code calibrating unit that counts the first code according to the result of a comparison between the first line voltage and a reference voltage, stops the code count when the first code reaches a maximum value or a minimum value, and stores a code value based on a final count; a second ODT voltage generating unit that outputs a second line voltage by calibrating an input voltage with a resistance ratio according to the first code and a second code having at least two bits; and a second code calibrating unit that counts the second code according to the result of a comparison between the second line voltage and the reference voltage, stops the code count when the second code reaches the maximum value or the minimum value, and stores a code value based on a final count.

Another embodiment of the present invention provides a method of on-die termination of a semiconductor memory that includes a first voltage generating unit in which a resistance ratio is determined according to a first code, and a second voltage generating unit in which a resistance ratio is determined according to a second code. The method includes primarily comparing a first line voltage output from the first voltage generating unit with a reference voltage, stopping the counting of the first code according to the first code and a result of the primary comparison, and storing a code value based on a final count; and secondarily comparing a second line voltage output from the second voltage generating unit and the reference voltage, stopping the counting of the second code according to the second code and a result of the secondary comparison, and storing a code value based on a final count.

DESCRIPTION OF EXEMPLARY EMBODIMENTS

Embodiments of an apparatus for on-die termination of a semiconductor memory and a method of the same will now be described with reference to the accompanying drawings.

Figure 4:
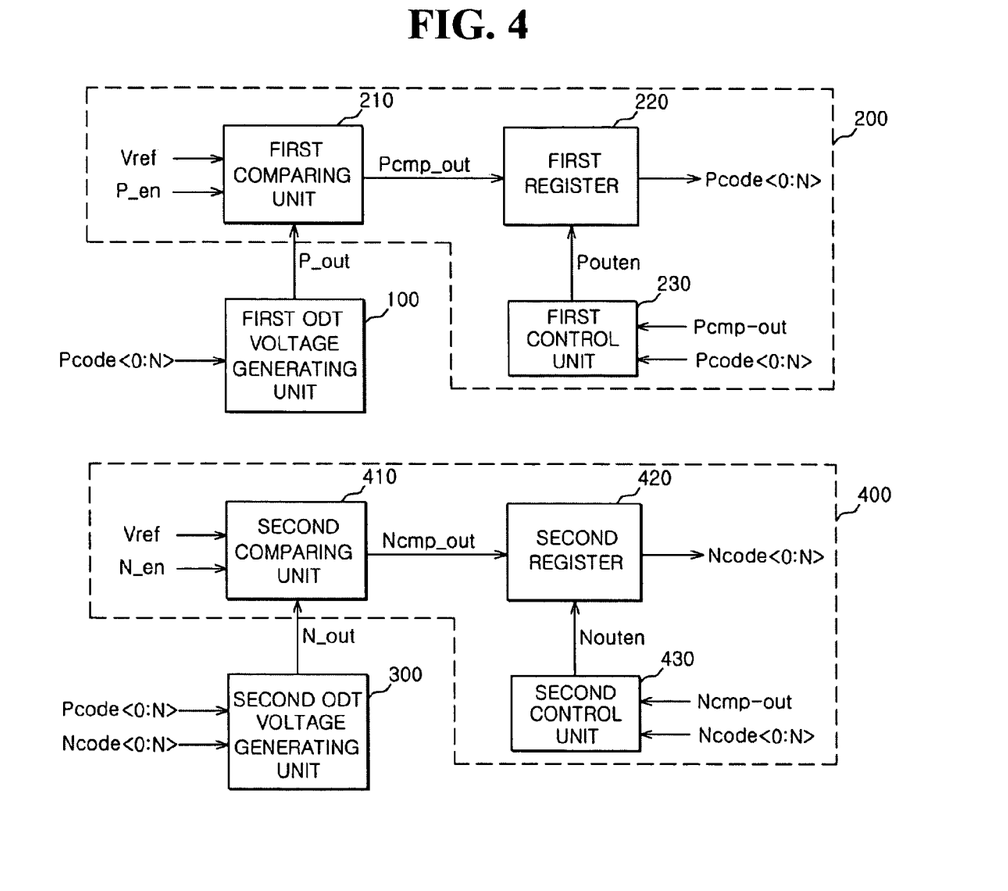
FIG. 4 is a block diagram showing the structure of an apparatus for on-die termination of a semiconductor memory according to an embodiment of the present invention.

As shown in FIG. 4, the apparatus for on-die termination of a semiconductor memory according to an embodiment of the present invention includes a first ODT (On-Die Termination) voltage generating unit 100 that outputs a first line voltage P_out by calibrating an input voltage with a resistance ratio according to a Pcode<0:N> having at least two bits; a first code calibrating unit 200 that counts the Pcode<0:N> according to the result of a comparison between the first line voltage P_out and a reference voltage Vref, stops the code count when the Pcode<0 N> reaches the maximum value or the minimum value, and stores a code value based on a final count having the maximum value or the minimum value; a second ODT voltage generating unit 300 that outputs a second line voltage N_out by calibrating an input voltage with a resistance ratio according to the Pcode<0:N> and the Ncode<0:N> having at least two bits; and a second code calibrating unit 400 that counts the Ncode<0:N> according to the result of a comparison between the second: line voltage N_out and the reference voltage Vref, stops the code count when the Ncode<0:N> reaches the maximum value or the minimum value, and stores a code value based on a final count having the maximum value or the minimum value.

The first ODT voltage generating unit 100 has the same structure as in FIG. 2, and the second ODT voltage generating unit 300 has the same structure as in FIG. 3. Therefore, descriptions thereof will be omitted.

The first code calibrating unit 200 includes a first comparing unit 210 that compares the first line voltage P_out and the reference voltage Vref according to a first enable signal P_en so as to output a first comparison result signal Pcmp_out; a first register 220 that counts the Pcode<0:N> according to the first comparison result signal Pcmp_but and a first control signal Pouten; and a first control unit 230 that generates the first control signal Pouten according to the first comparison result signal Pcmp_out and the Pcode<0:N>.

The first register 220 performs an up-counting operation or a down-counting operation according to the level of the first comparison result signal Pcmp_out. In addition, the first register 220 stops the counting operation when the first control signal Pouten is disabled.

The second code calibrating unit 400 includes a second comparing unit 410 that compares the second line voltage N_out and the reference voltage Vref according to a second enable signal N_en so as to output a second comparison result signal Ncmp_out; a second register 420 that counts the Ncode<0:N> according to the second comparison result signal Ncmp_out and a second control signal Nouten; and a second control unit 430 that generates the second control signal Nouten according to the second comparison result signal Ncmp_out and the Ncode<0:N>.

The second register 420 performs an up-counting operation or a down-counting operation according to the level of the second comparison result signal Ncmp_out. In addition, when the second control signal Nouten is disabled, the second register 420 stops the counting operation.

Figure 5:
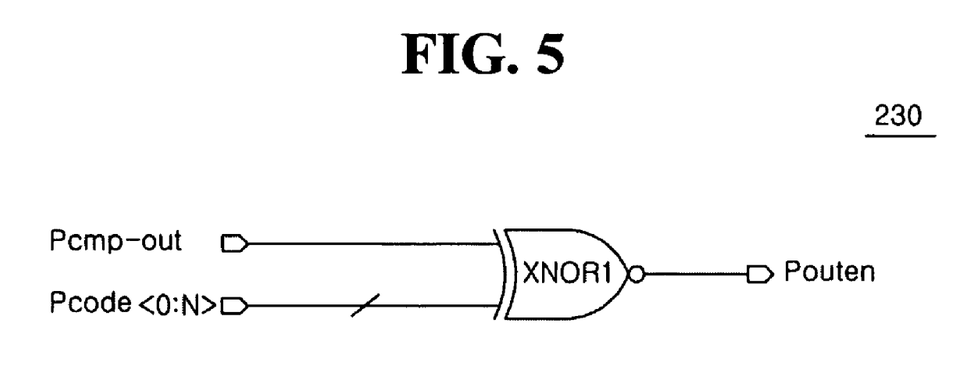
FIG. 5 is a circuit diagram showing the structure of a first control unit in FIG. 4.

As shown in FIG. 5, the first control unit 230 includes a first XNOR gate XNOR1 that receives the first comparison result signal Pcmp_out and the Pcode<0:N> to output the first control signal Pouten.

When the first comparison result signal Pcmp_out is at a level that indicates an up-counting operation of the first register 220, that is, when the first comparison result signal Pcmp_out is at a high level, the first control unit 230 disables the first control signal Pouten when the Pcode<0:N> reaches the maximum value (for example, 11111 when the Pcode<0:N> has five bits). In addition, when the first comparison result signal Pcmp_out is at a level that indicates a down-counting operation of the first register 220, that is, when the first comparison result signal Pcmp_out is at a low level, the first control unit 230 disables the first control signal Pouten when the Pcode<0:N> reaches the minimum value 00000.

Figure 6:
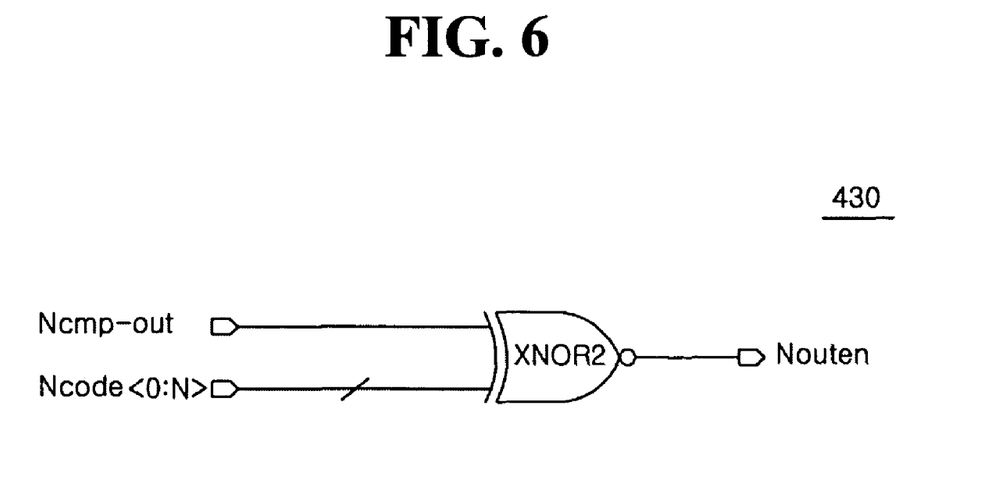
FIG. 6 is a circuit diagram showing the structure of a second control unit in FIG. 4.

As shown in FIG. 6, the second control unit 430 includes a second XNOR gate XNOR2 that receives the second comparison result signal Ncmp_out and the Ncode<0:N> to output the second control signal Nouten.

When the second comparison result signal Ncmp_out is at a level that indicates an up-counting operation of the second register 420, that is, the second comparison result signal Ncmp_out is at a high level, the second control unit 430 disables the second control signal Nouten when the Ncode<0:N> reaches the maximum value (for example, 11111 when Ncode<0:N> has five bits). In addition, when the second comparison result signal Ncmp_out is at a level that indicates a down-counting operation of the second register 420, that is, the second comparison result signal Ncmp_out is at a low level, the second control unit 430 disables the second control signal Nouten when the Ncode<0:N> reaches the minimum value 00000.

The operation of the apparatus for on-die terminal of a semiconductor memory according to the embodiment of the present invention that has the above-described structure will be described below.

First, the operation related to Pcode<0:N> calibration will be described below.

At the time of an initial operation, an initial value of Pcode<0:N> is input to the first ODT voltage generating unit 100 from the first register 220.

The first ODT voltage generating unit 100 outputs a first line voltage P_out according to resistors connected on the basis of the Pcode<0:N> and an external resistor ZQ.

The first comparing unit 210 compares the first line voltage P_out and a reference voltage Vref according to a first enable signal P_en to thereby output a first comparison result signal Pcmp_out according to the comparison. At this time, as shown in FIG. 7, when the first line voltage P_out is smaller than the reference voltage Vref, the first comparing unit 210 outputs the first comparison result signal Pcmp_out at a high level such that the first register 220 performs up counting.

Figure 7:
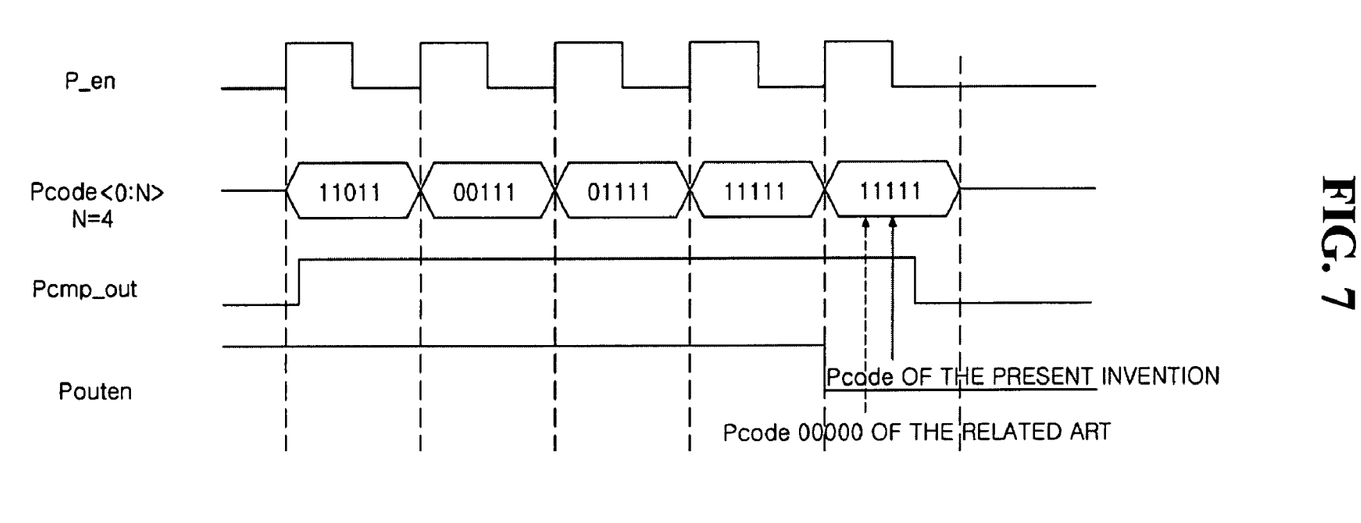
FIG. 7 is a timing diagram showing output waveforms of respective units associated with first code calibration.

As shown in FIG. 7, the first register 220 increases the Pcode<0:N> by performing an up-counting operation on the Pcode<0:N> according to the first comparison result signal Pcmp_out.

At this time, the first ODT voltage generating unit 100 feeds back the first line voltage P_out based on the Pcode<0:N>, which is changed according to the up-counting operation, to the first comparing unit 210. As a result, the first comparing unit 210 repeats the above-described comparison operation and a corresponding operation of outputting the first comparison result signal Pcmp_out.

As shown in FIG. 7, when the first comparing unit 210 keeps the first comparison result signal Pcmp_out at the high level because the first line voltage P_out is smaller than the reference voltage Vref, even though the up-counting operation on the Pcode<0:N> continues during an enable period of the first enable signal P_en, the Pcode<0:N> reaches the maximum value 11111.

Therefore, the first control unit 230 of FIG. 5 receives the Pcode<0:N> reaching the maximum value 11111 and the first comparison result signal Pcmp_out at the high level. Further, as shown in FIG. 7, the first control unit 230 disables the first control signal Pouten at a low level.

The first register 220 stops the counting operation according to the disabled first control signal Pouten and stores the current Pcode<0:N>.

In contrast, the first register 220 performs down counting if the first comparison result signal Pcmp_out is at a low level, and when the Pcode<0:N> reaches the minimum value 00000, the first control unit 230 disables the first control signal Pouten at the low level. Therefore, the first register 220 stops the counting operation and stores the Pcode<0:N> that corresponds to the minimum value 00000.

After the above-described Pcode<0:N> calibration is completed, Ncode<0:N> calibration is performed, which will be described below.

An initial value of Ncode<0:N> is input to the second ODT voltage generating unit 300 from the second register 420. The Pcode<0: N> that is input to the second ODT voltage generating unit 300 is the same as the code input to the first ODT voltage generating unit 100.

The second ODT voltage generating unit 300 outputs a second line voltage N_out according to resistors connected on the basis of the Pcode<0:N> and the Ncode<0:N>.

Then, the second comparing unit 410 compares the second line voltage N_out and the reference voltage Vref according to a second enable signal N_en to thereby output a second comparison result signal Ncmp_out according to the comparison. At this time, as shown in FIG. 8, when the second line voltage N_out is larger than the reference voltage Vref, the second comparing unit 410 outputs the second comparison result signal Ncmp_out at a low level such that the second register 420 performs down counting.

Figure 8:
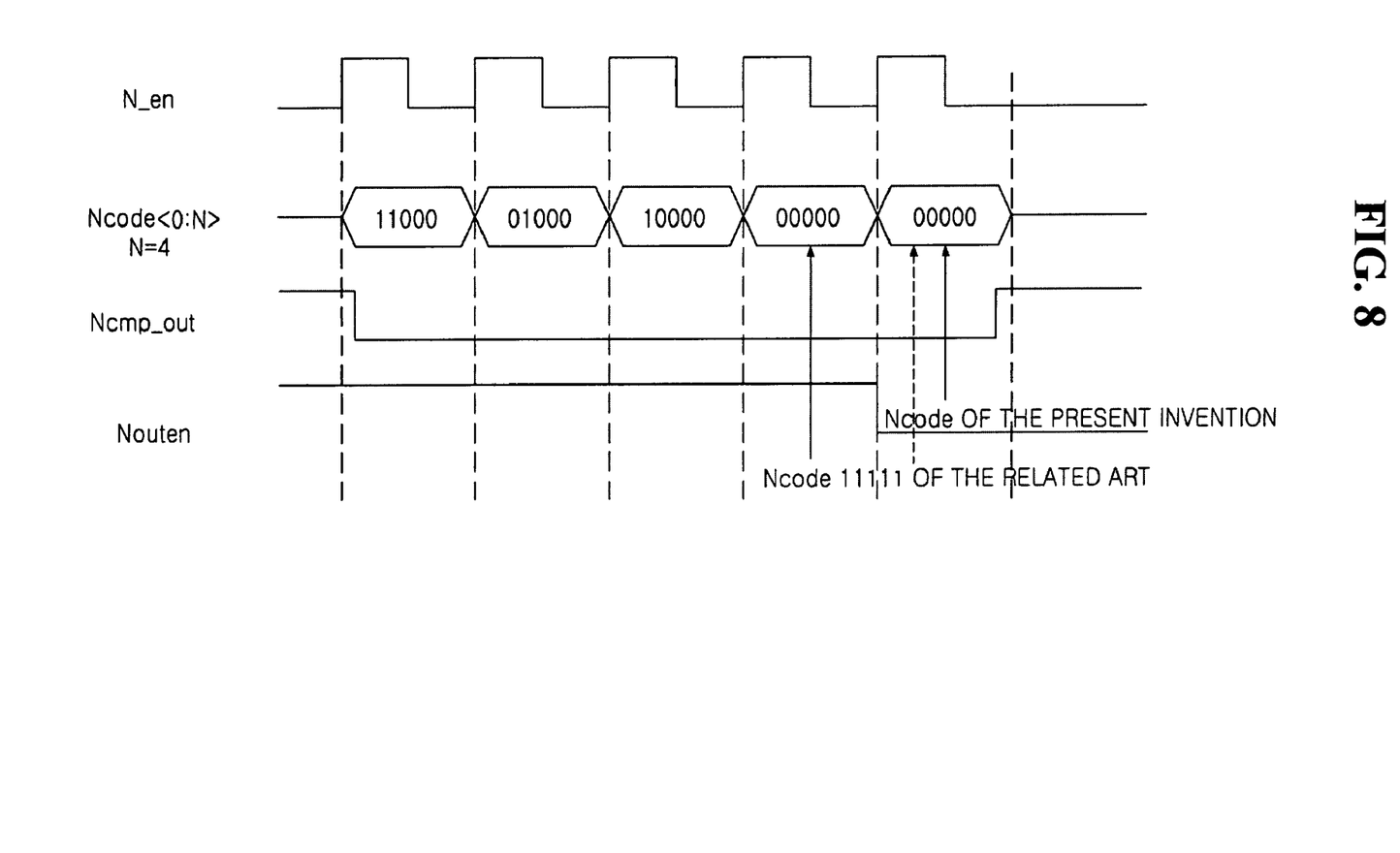
FIG. 8 is a timing diagram showing output waveforms of respective units associated with second code calibration.

As shown in FIG. 8, the second register 420 decreases the Ncode<0:N> by performing a down-counting operation on the Ncode<0:N> according to the second comparison result signal Ncmp_out.

At this time, the second ODT voltage generating unit 300 feeds back the second line voltage N_out based on the Pcode<0:N> and the Ncode<0:N>, which is decreased by the down-counting operation, to the second comparing unit 410. As a result, the second comparing unit 410 repeats the above-described comparison operation and a corresponding operation of outputting the second comparison result signal Ncmp_out.

As shown in FIG. 8, when the second comparing unit 410 keeps the second comparison result signal Ncmp_out at the low level because the second line voltage N_out is larger than the reference voltage Vref, even though the down-counting operation on the Ncode<0:N> continues during an enable period of the second enable signal N_en, the Ncode<0:N> reaches the minimum value 00000.

Therefore, the second control unit 430 of FIG. 6 receives the Ncode<0:N> reaching the minimum value 00000 and the second comparison result signal Ncmp_out at the low level. Further, as shown in FIG. 8, the second control unit 430 disables the second control signal Nouten at a low level.

The second register 420 stops the counting operation according to the disabled second control signal Nouten and stores the current Ncode<0:N> value.

In contrast, when an output of the second comparing unit 410 is at a high level, an up-counting operation of the second register 420 is performed, and when the Ncode<0:N> reaches the maximum value 11111, the second control unit 430 disables the second control signal Nouten at the low level. Therefore, the second register 420 stops the counting operation and stores the Ncode<0:N> that corresponds to the maximum value 11111.

It will be apparent to those skilled in the art that various modifications and changes may be made without departing from the scope and spirit of the present invention. Therefore, it should be understood that the above embodiments are not limitative, but illustrative, in all aspects. The scope of the invention is defined by the appended claims rather than by the description preceding them, and therefore all changes and modifications that fall within the metes and bounds of the claims, or equivalents of such metes and bounds are therefore intended to be embraced by the claims.

The apparatus for on-die termination of a semiconductor memory and the method of the same according to the embodiment of the present invention can prevent calibration errors of code values to allow a normal data input and a normal data output, thereby increasing the reliability of a memory operation.

What is claimed is:

1. An apparatus for on-die termination of a semiconductor memory, comprising:
   a first ODT (On-Die Termination) voltage generating unit configured to output a first line voltage by calibrating an input voltage with a resistance ratio according to a first code having at least two bits;
   a first code calibrating unit that counts the first code according to the result of a comparison between the first line voltage and a reference voltage, stops the code count when the first code is one of two target values that are a maximum value and a minimum value, and stores the first code corresponding to the maximum value or the minimum value;
   a second ODT voltage generating unit that outputs a second line voltage by calibrating an input voltage with a resistance ratio according to the first code and a second code having at least two bits; and
   a second code calibrating unit that counts the second code according to the result of a comparison between the second line voltage and the reference voltage, stops the code count when the second code is one of two target values that are a maximum value and a minimum value, and stores the second code corresponding to the maximum value or the minimum value, wherein the first code calibrating unit includes a first XNOR gate that is configured to stop the code counting of the first code in response to the first code and the result of the comparison between the first line voltage and the reference voltage, and the second code calibrating unit includes a second XNOR gate that is configured to stop the code counting of the second code in response to the second code and the result of the comparison between the second line voltage and the reference voltage.

2. The apparatus of claim 1,
   wherein the first ODT voltage generating unit includes:
   a plurality of switching elements that are connected to power terminals and are turned on according to the first code, and
   a plurality of resistors that are connected between the plurality of switching elements and ground terminals VSSQ, respectively.

3. The apparatus of claim 1,
   wherein the first code calibrating unit includes:
   a comparison unit that compares the first line voltage with the reference voltage to output a first comparison result signal;
   a register that counts the first code according to the first comparison result signal and a first control signal; and
   a control unit that generates the first control signal according to the first comparison result signal and the first code.

4. The apparatus of claim 3,
   wherein the register stops the counting when the first control signal is disabled.

5. The apparatus of claim 3,
   wherein the control unit disables the first control signal when the first comparison result signal is at a level that indicates an up-counting operation of the register, and the first code reaches the maximum value.

6. The apparatus of claim 3,
   wherein the control unit disables the first control signal when the first comparison result signal is at a level that indicates a down-counting operation of the register, and the first code reaches the minimum value.

7. The apparatus of claim 3,
   wherein the control unit includes the first XNOR gate that receives the first comparison result signal and the first code.

8. The apparatus of claim 1,
   wherein the second ODT voltage generating unit includes:
   a first transistor group having a plurality of transistors that are connected to power terminals and are turned on according to the second code;
   a first resistor group having a plurality of resistors that are connected between the transistors of the first transistor group and ground terminals, respectively;
   a second resistor group having a plurality of resistors that are connected to the resistors of the first resistor group; and
   a second transistor group having a plurality of transistors that are connected between the resistors of the second resistor group and the ground terminals, respectively, and are turned on according to the second code.

9. The apparatus of claim 1,
   wherein the second code calibrating unit includes:
   a comparison unit that compares the second line voltage with the reference voltage so as to output a second comparison result signal;
   a register that counts the second code according to the second comparison result signal and a second control signal; and
   a control unit that generates the second control signal according to the second comparison result signal and the second code.

10. The apparatus of claim 9,
    wherein the register stops the counting when the second control signal is disabled.

11. The apparatus of claim 9,
    wherein the control unit disables the second control signal when the second comparison result signal is at a level that indicates an up-counting operation of the register, and the second code reaches the maximum value.

12. The apparatus of claim 9,
    wherein the control unit disables the second control signal when the second comparison result signal is at a level that indicates a down-counting operation of the register, and the second code reaches the minimum value.

13. The apparatus of claim 9,
wherein the control unit includes the second XNOR gate that receives the second comparison result signal and the second code.

14. A method of on-die termination of a semiconductor memory that includes a first voltage generating unit in which a resistance ratio is determined according to a first code and a second voltage generating unit in which a resistance ratio is determined according to a second code, the method comprising:
    primarily comparing a first line voltage output from the first voltage generating unit with a reference voltage;
    counting the first code according to a result of the primary comparison;
    stopping the counting of the first code when the first code is one of two target values that are a maximum value and a minimum value defining that every bit of the first code is the same value by using a first code calibrating unit including a first XNOR gate that is configured to stop the first code counting in response to the first code and the result of the primary comparison between the first line voltage and the reference voltage, and storing the first code corresponding to the maximum value or the minimum value;
    secondarily comparing a second line voltage output from the second voltage generating unit and the reference voltage;
    counting the second code according to a result of the secondarily comparison; and
    stopping the counting of the second code when the second code is one of two target values that are a maximum value and a minimum value defining that every bit of the second code is the same value by using a second code calibrating unit including a second XNOR gate that is configured to stop the second code counting in response to the second code and the result of the secondarily comparison between the second line voltage and the reference voltage, and storing the second code corresponding to the maximum value or the minimum value.

15. The method of claim 14,
wherein the stopping of the counting of the first code and the storing of the code value based on the final count is stopping the counting of the first code and storing the code value based on the final count when the signal level according to the result of the primary comparison is the same as the level of every bit in the first code.

16. The method of claim 14,
wherein the stopping of the counting of the first code and the storing of the code value based on the final count is stopping the counting of the first code and storing the code value based on the final count when the result of the primary comparison is at a level that indicates an up-counting operation, and the first code reaches the maximum value.

17. The method of claim 14,
wherein the stopping of the counting of the first code and the storing of the code value based on the final count is stopping the counting of the first code and storing the code value based on the final count when the result of the primary comparison is at a level that indicates a down-counting operation, and the first code reaches the minimum value.

18. The method of claim 14,
wherein the stopping of the counting of the second code and the storing of the code value based on the final count is stopping the counting of the second code and storing the code value based on the final count when the signal level according to the result of the secondary comparison is the same as the level of every bit in the second code.

19. The method of claim 14,
wherein the stopping of the counting of the second code and the storing of the code value based on the final count is stopping the counting of the second code and storing the code value based on the final count when the result of the secondary comparison is at a level that indicates an up-counting operation, and the second code reaches the maximum value.

20. The method of claim 14,
wherein the stopping of the counting of the second code and the storing of the code value based on the final count is stopping the counting of the second code and storing the code value based on the final count when the result of the secondary comparison is at a level that indicates a down-counting operation, and the second code reaches the minimum value.

* * * * *